(12) United States Patent
Weng

(10) Patent No.: US 11,756,798 B2
(45) Date of Patent: Sep. 12, 2023

(54) METHOD FOR IMPROVING METAL WORK FUNCTION BOUNDARY EFFECT

(71) Applicant: SHANGHAI HUALI INTEGRATED CIRCUIT CORPORATION, Shanghai (CN)

(72) Inventor: Wenyin Weng, Shanghai (CN)

(73) Assignee: Shanghai Huali Integrated Circuit Corporation, Shanghai (CN)

(*) Notice: Subject to any disclaimer, the term of this patent is extended or adjusted under 35 U.S.C. 154(b) by 119 days.

(21) Appl. No.: 17/522,723

(22) Filed: Nov. 9, 2021

(65) Prior Publication Data
US 2022/0406615 A1 Dec. 22, 2022

(30) Foreign Application Priority Data
Jun. 21, 2021 (CN) .......................... 202110685076.2

(51) Int. Cl.
*H01L 21/3213* (2006.01)
*H10B 10/00* (2023.01)

(52) U.S. Cl.
CPC ....... *H01L 21/32139* (2013.01); *H10B 10/12* (2023.02)

(58) Field of Classification Search
CPC ........... H01L 21/32139; H01L 27/1104; H10B 10/12
See application file for complete search history.

(56) References Cited

U.S. PATENT DOCUMENTS

2014/0363960 A1* 12/2014 Kim .................. H01L 21/82345
438/585

\* cited by examiner

*Primary Examiner* — Walter H Swanson
(74) *Attorney, Agent, or Firm* — Alston & Bird LLP

(57) ABSTRACT

The present application provides a method for improving the metal work function boundary effect in FinFET process, the method comprises steps of: depositing a first TiN layer on four fin structures. The first TiN layer has no gap between the second and the third fin structures; removing the first TiN layer up to a first distance from the midline between the second and third fin structures at the second fin structure side; depositing a second TiN layer; removing the second and first TiN layers from second fin structure. The thickness of the TiN layer at the bottom edge of the fin structure at the later structure of the ultra-low threshold voltage P-type transistor will be smaller from this process. Thus formed TiN layer is less prone to a bottom undercut during etching, thereby reducing the metal boundary effect and increasing of the threshold voltage of the device.

8 Claims, 4 Drawing Sheets

Step 1. Arranging a first, a second, a third and a fourth fin structures in sequence on a same substrate, and disposing a first TiN layer on said fin structures, wherein the first TiN layer is disposed in a space between the second fin structure and the third fin structure

↓

Step 2. Performing lithography and etching to remove the first TiN layer from above the third fin structure and to remove part of the first TiN layer between the second and the third fin structures, wherein the part starts from a first distance d1 away from a midline between them

↓

Step 3. Disposing a second TiN layer, wherein the second TiN layer covers the first TiN layer on the first and second fin structures, a space between the second and the third fin structures, the third fin structure, and the first TiN layer on the fourth fin structure

↓

Step 4. Performing lithography and etching to remove the second and first TiN layers on the second fin structure, wherein a portion of the second TiN layer between the second and third fin structures at a side of the second fin structure is removed, wherein said portion ends at a second distance from the midline between them

↓

Step 5. Disposing a third TiN layer, wherein the third TiN layer covers the second TiN layer on the first fin structure, the second fin structure, the second TiN layer on the third fin structure, and the second TiN layer on the fourth fin structure, wherein there is no gap in the third TiN layer between the second and the third fin structures

↓

Step 6. Etching to remove the first, the second and the third TiN layers from the first fin structure

FIG. 8

METHOD FOR IMPROVING METAL WORK FUNCTION BOUNDARY EFFECT

CROSS-REFERENCES TO RELATED APPLICATIONS

This application claims the priority to Chinese patent application No. CN 202110685076.2, filed on Jun. 21, 2021 at CNIPA, and entitled "METHOD FOR IMPROVING METAL WORK FUNCTION BOUNDARY EFFECT", the disclosure of which is incorporated herein by reference in entirety.

TECHNICAL FIELD

The present application relates to the technical field of semiconductor chip technology, in particular, to a method for improving the metal work function boundary effect.

BACKGROUND

The current techniques of making a 14 nm FinFET is prone to the metal boundary effect (MBE), in particular between the fins of an N-type SRAM and a P-type SRAM, during the manufacturing process. The metal boundary effect is due to the titanium nitride (TiN) undercut occurring at the side bottom of the fin covering the P-type SRAM. FIG. 1 is a schematic diagram of a TiN undercut defect occurring at the side bottom of a fin structure in the current process. Moreover, the reinforcement of the metal boundary effect may cause a gradual decrease in the threshold voltage of the P-type SRAM.

Therefore, it is necessary to alleviate the metal boundary effect so as to increase the threshold voltage of the P-type SRAM in 14 nm node FinFET.

BRIEF SUMMARY

In view of the above-mentioned defect of the current process, the present application provides a method for mitigating the metal work function boundary effect, thus the threshold voltage of the P-type SRAM in the 14 nm FinFET process will not decrease with the reinforcement of the metal boundary effect, as in the current process.

The present application provides a method for improving the metal work function boundary effect. The method comprises the following steps:

A method for improving the metal work function boundary effect, at least comprising following steps:

step 1: arranging a first, a second, a third and a fourth fin structures in sequence on a same substrate, and disposing a first TiN layer on said fin structures, wherein the first TiN layer is disposed in a space between the second fin structure and the third fin structure;

step 2: performing lithography and etching to remove the first TiN layer from above the third fin structure and to remove part of the first TiN layer between the second and the third fin structures, wherein the part starts from a first distance d1 away from a midline between them;

step 3: disposing a second TiN layer, wherein the second TiN layer covers the first TiN layer on the first and second fin structures, a space between the second and the third fin structures, the third fin structure, and the first TiN layer on the fourth fin structure;

step 4: performing lithography and etching to remove the second and first TiN layers on the second fin structure, wherein a portion of the second TiN layer between the second and third fin structures at a side of the second fin structure is removed, wherein said portion ends at a second distance from the midline between them;

step 5: disposing a third TiN layer, wherein the third TiN layer covers the second TiN layer on the first fin structure, the second fin structure, the second TiN layer on the third fin structure, and the second TiN layer on the fourth fin structure, wherein there is no gap in the third TiN layer between the second and the third fin structures; and step 6: etching to remove the first, the second and the third TiN layers from the first fin structure. step 1: providing the first to the fourth fin structures arranged in sequence on the same substrate, and depositing a first TiN layer simultaneously on the first to fourth fin structures, wherein the first TiN layer on the second and third fin structures is distributed continuously;

step 2: performing lithography and etching to remove the first TiN layer on the third fin structure, wherein the edge of the removed first TiN layer is located at a first distance from the midline between the second and third fin structures and close to the second fin structure;

step 3: depositing a second TiN layer, wherein the second TiN layer covers the first TiN layer on the first and second fin structures, the third fin structure, and the first TiN layer on the fourth fin structure, and the second TiN layer on the second fin structure and the third fin structure is distributed continuously;

step 4: performing lithography and etching to remove the second and first TiN layers on the second fin structure and the second fin structure, wherein a portion of the second TiN layer between the second and third fin structures and close to the second fin structure is removed, and the edge of the removed second TiN layer is located at a second distance from the midline between the second and third fin structures and close to the second fin structure;

step 5: depositing a third TiN layer, wherein the third TiN layer covers the second TiN layer on the first fin structure, the second fin structure, the second TiN layer on the third fin structure, and the second TiN layer on the fourth fin structure, and the third TiN layer on the second and third fin structures is distributed continuously; and step 6: etching and removing the first fin structure and the first to third TiN layers on the first fin structure.

In some examples, the first fin structure in step 1 is used for an ultra-low threshold voltage N-type transistor; the second fin structure is used for a standard threshold voltage N-type SRAM; the third fin structure is used for a standard threshold voltage P-type SRAM; and the fourth fin structure is used for an ultra-low threshold voltage P-type transistor.

In some examples, the first TiN layer on the first and second fin structures in step 1 is distributed discontinuously; and the first TiN layer on the third and fourth fin structures is distributed discontinuously.

In some examples, the second TiN layer on the first fin structure and the second fin structure in step 3 is distributed discontinuously.

In some examples, the second TiN layer on the fourth fin structure and the third fin structure in step 3 is distributed discontinuously.

In some examples, the first distance in step 2 is greater than the second distance in step 4.

In some examples, the third TiN layer on the first fin structure and the second fin structure in step 5 is distributed discontinuously.

In some examples, the third TiN layer on the third fin structure and the fourth fin structure in step 5 is distributed discontinuously.

As described above, the method for improving the metal work function boundary effect of the present application has the following beneficial effects: by adopting the method of the present application, the thickness of the TiN layer at the bottom edge of the fin structure of an ultra-low threshold voltage P-type transistor may be smaller; and the TiN layer is less prone to a bottom undercut during etching, thereby reducing the metal boundary effect and facilitating the increase of the threshold voltage of the device.

BRIEF DESCRIPTION OF THE DRAWINGS

FIG. 8 is a flowchart showing the steps of the method for improving the metal work function boundary effect according to the present application.

DETAILED DESCRIPTION OF THE DISCLOSURE

The implementation of the present application is described below with specific examples, and those skilled in the art can easily understand other advantages and effects of the present application from the content disclosed in the description. The present application can also be implemented or applied in other different specific embodiments, and various details in the description can also be modified or changed on the basis of different viewpoints and applications without departing from the spirit of the present application.

It should be noted that the drawings from FIG. 2 to FIG. 8 provided in the embodiments only schematically illustrate the basic concept of the present application. The drawings only show the components related to the present application but are not drawn according to the number, shape, and size of the components in actual implementation. The type, quantity, and proportion of each component can be changed at random during actual implementation, and the component layout may be more complicated.

Figure 1:
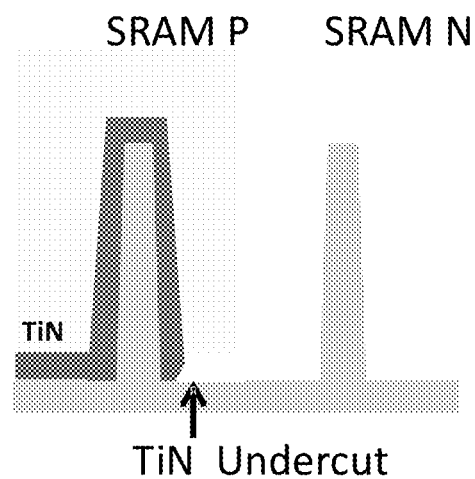
FIG. 1 is a schematic diagram of a TiN undercut defect occurring at the side bottom of a fin structure in the current process.
Figure 2:
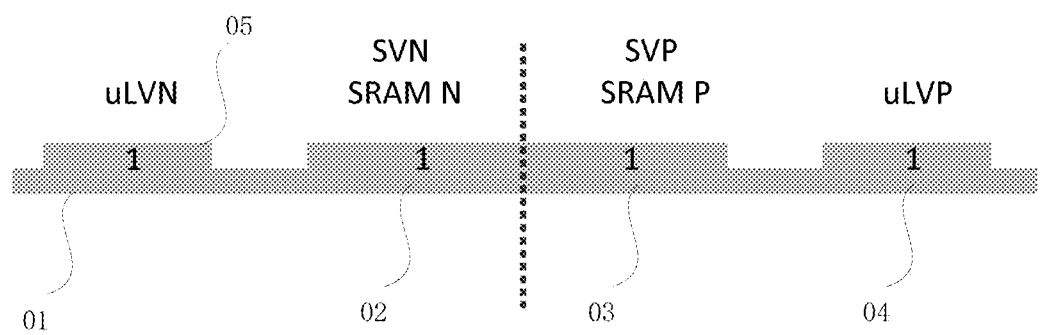
FIG. 2 shows a schematic diagram after forming the first TiN layer on the four fin structures according to the present disclosure.

The present application provides a method for improving the metal work function boundary effect. FIG. 8 is a flowchart showing the steps of the method for improving the metal work function boundary effect according to the present application. The method at least includes the following steps:

Step 1: arranging the first, second, third and fourth fin structures in sequence on a same substrate, and depositing the first TiN layer simultaneously on said fin structures, wherein the first TiN layer covers the space between the second and third fin structures. FIG. 2 shows a schematic diagram of a structure of after forming the first TiN layer on the four fin structures according to the present disclosure. In step 1, the first, second, third and fourth fin structures arranged in sequence on the same substrate, i.e., the first fin structure 01, the second fin structure 02, the third fin structure 03, and the fourth fin structure 04 are displaced from left to right shown in FIG. 2; and then the first TiN layer 05 is deposited simultaneously on the four fin structures, wherein the first TiN layer 05 covers the space between the second fin structure 02 and the third fin structure 03.

More specifically, in this embodiment of the present application, the first fin structure 01 in step 1 might be later related to being part of an ultra-low threshold voltage N-type transistor (uLVN); the second fin structure 02 might be later related to being part of a standard threshold voltage N-type SRAM (SVN or SRAM N); the third fin structure 03 might be later related to being part of a standard threshold voltage P-type SRAM (SVP or SRAM P); and the fourth fin structure 04 might be later related to being part of an ultra-low threshold voltage P-type transistor (uLVP).

More specifically, in this embodiment of the present application, referring to FIG. 2, in step 1 the first TiN layer is deposited on the first fin structure 01, the second fin structure 02, the third fin structure 03 and the fourth fin structure 04, however it is not deposited between the first and the second fin structures, and third and the fourth fin structures, therefore, leaving a space between the edge of the first fin structure and the edge of the second fin structure and between the edge of the third fin structure and the edge of the fourth fin structure without the first TiN layer.

Figure 3:
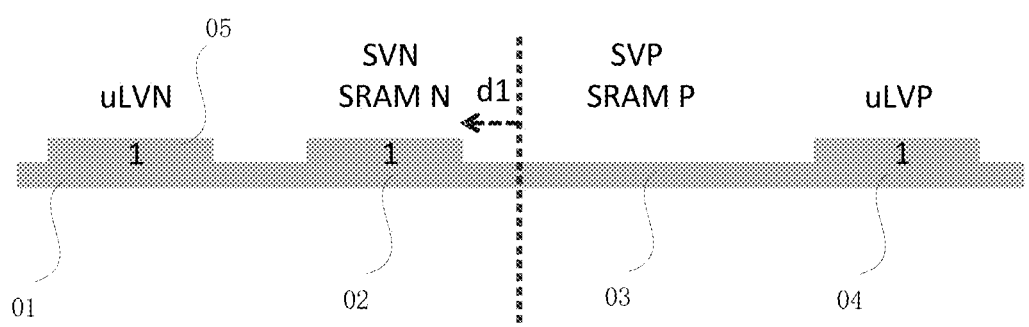
FIG. 3 is a schematic diagram after removing the first TiN layer from the third fin structure according to the present application.

Step 2: lithography and etching are performed to remove the first TiN layer from above the third fin structure 03 and part of the TiN layer between the second and the third fin structures, starting from a first distance d1 away from the midline at the second fin structure side. FIG. 3 is a schematic diagram after removing the first TiN layer from the third fin structure according to the present application. In step 2, the edge of the removed first TiN layer is located at the first distance d1 away from the midline (the vertical dashed line in FIG. 3) between the second and third fin structures at the side of the second fin structure 02.

Figure 4:
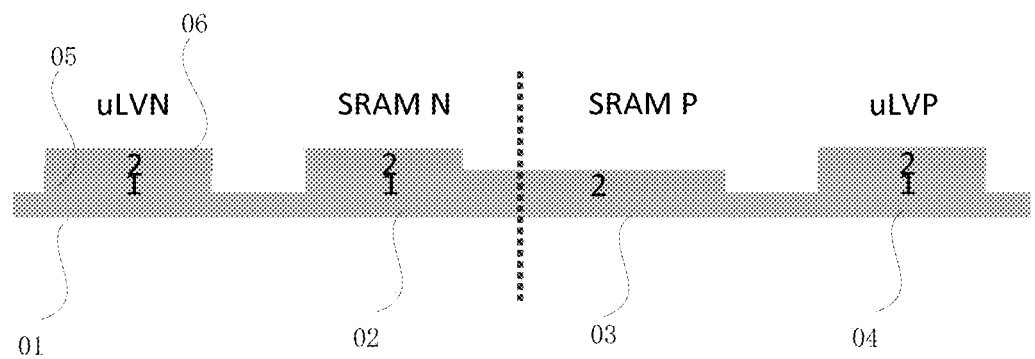
FIG. 4 is a schematic diagram after depositing the second TiN layer according to the present application.

Step 3: a second TiN layer is deposited, wherein the second TiN layer is disposed on the first TiN layer on the first, the second, and the fourth fin structures, in addition, the second TiN layer also extends continuously from the second to the third fin structures. Referring to FIG. 4, which is a schematic diagram after depositing the second TiN layer according to the present disclosure. In step 3, the second TiN layer 06 is deposited over the fin structures, wherein the second TiN layer 06 covers the first TiN layer 05 on the first fin structure 01 and second fin structure 02, the third fin structure 03, and the first TiN layer 05 on the fourth fin structure 04, in addition, the second TiN layer 06 extends from the first TiN on the second fin structure 02 to the third fin structure 03.

More specifically, in this embodiment of the present application, in step 3 there is a space in the second TiN layer 06 between the first fin structure 01 (i.e., the first TiN layer on the first fin structure) and the second fin structure (i.e., the first TiN layer on the second fin structure).

Figure 5:
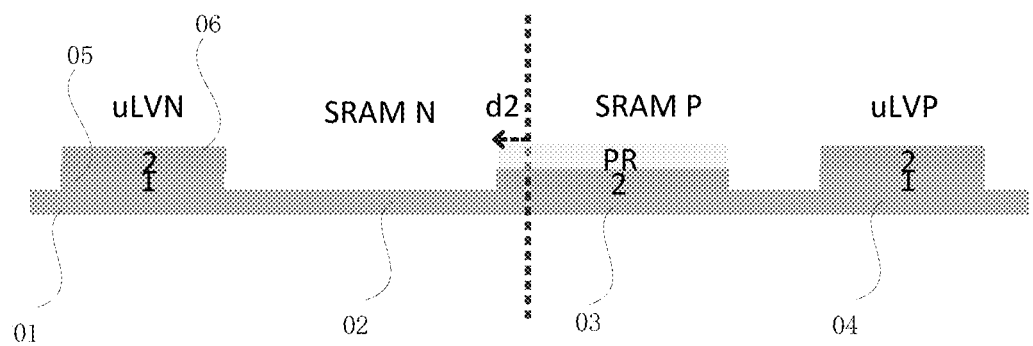
FIG. 5 is a schematic diagram after removing the first and second TiN layers from the second fin structure according to the present application.

Step 4: lithography and etching are performed to remove the second and first TiN layers from the second fin structure, wherein a portion of the second TiN layer between the second and third fin structures at the side of the second fin structure is removed up to the second distance from the midline between them. Referring to FIG. 5, FIG. 5 is a schematic diagram after removing the first and second TiN layers from the second fin structure according to the present application. In step 4, lithography and etching are performed to remove the second and first TiN layers from the second fin structure 02, wherein the portion of the second TiN layer between the second and third fin structures at the side of the second fin structure 02 is removed up to the the second distance d2 from the midline between them.

More specifically, according to this embodiment of the present application, referring to FIG. 3 and FIG. 5, the first distance d1 in step 2 is greater than the second distance d2 in step 4.

Figure 6:
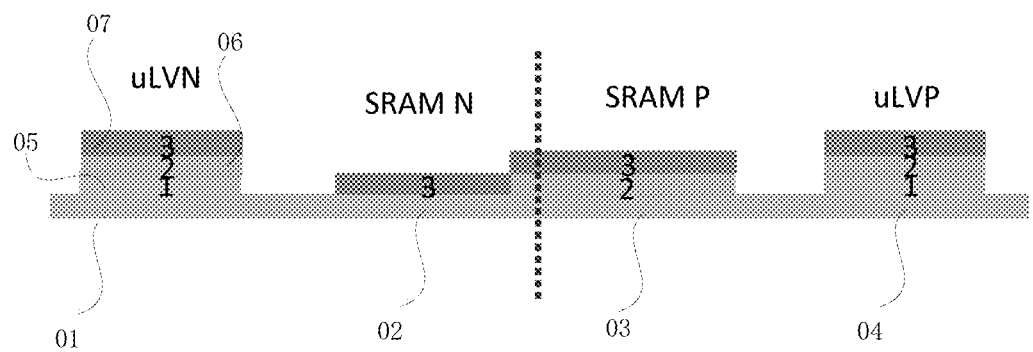
FIG. 6 is a schematic diagram after depositing a third TiN layer according to the present application.

Step 5: a third TiN layer is deposited, wherein the third TiN layer covers the second TiN layer on the first fin structure 01, the second fin structure 02, the space between the second fin structure and the second TiN layer on the third fin structure 03, and the second TiN layer on the fourth fin structure 04, herein the third TiN layer on the second and third fin structures is disposed without any gap. FIG. 6 is a schematic diagram after depositing the third TiN layer according to the present application. In step 5, the third TiN layer 07 is disposed on the second TiN layer 06 on the first fin structure 01, the second fin structure 02 and the space up to the second TiN layer 06 on the third fin structure 03, and the second TiN layer 06 on the fourth fin structure 04, herein the third TiN layer leaves no gap between the second and third fin structures.

In addition, according to this embodiment of the present application, there in a gap in the third TiN layer between the first fin structure and the second fin structure in step 5.

In addition, in this embodiment of the present application, there in a gap in the third TiN layer between the third TiN layer on the third fin structure and the fourth fin structure in step 5.

Figure 7:
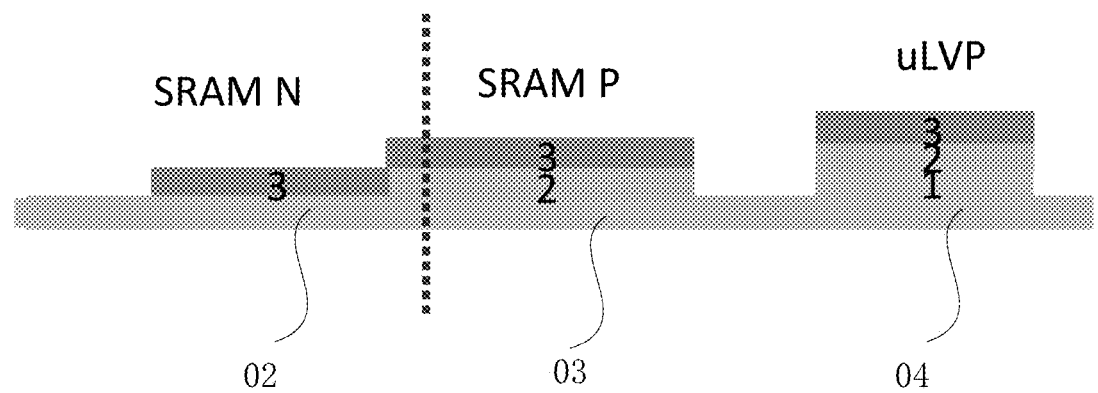
FIG. 7 is a schematic diagram after removing the first fin structure according to the present application.

Step 6: the first fin structure and the first to third TiN layers on the first fin structure are etched and removed. FIG. 7 is a schematic diagram after removing the first fin structure according to the present application. In step 6, the first fin structure 01 and the first to third TiN layers on the first fin structure 01 are etched and removed.

To sum up, by adopting the method of the present application, the thickness of the TiN layer at the bottom edge of the fin structure of the ultra-low threshold voltage P-type transistor (at uLVP) can be smaller; and the TiN layer is less prone to a bottom undercut during etching, thereby reducing the metal boundary effect seen in current process, thereby increasing the threshold voltage of the device.

The above embodiments only exemplarily illustrate the principle and effects of the present application, bus are not intended to limit the present application. Any person familiar with this technology can modify or change the above embodiments without departing from the spirit and scope of the present application. Therefore, any equivalent modification or change made by those with ordinary knowledge in the technical field without departing from the spirit and technical concept disclosed by the present application shall still be covered by the claims of the present application.

What is claimed is:

1. A method for improving the metal work function boundary effect, at least comprising the following steps:

step 1: arranging a first, a second, a third and a fourth fin structures in sequence on a same substrate, and disposing a first TiN layer on said fin structures, wherein the first TiN layer is disposed in a space between the second fin structure and the third fin structure;

step 2: performing lithography and etching to remove the first TiN layer from above the third fin structure and to remove part of the first TiN layer between the second and the third fin structures, wherein the part starts from a first distance d1 away from a midline between them;

step 3: disposing a second TiN layer, wherein the second TiN layer covers the first TiN layer on the first and second fin structures, a space between the second and the third fin structures, the third fin structure, and the first TiN layer on the fourth fin structure;

step 4: performing lithography and etching to remove the second and first TiN layers on the second fin structure, wherein a portion of the second TiN layer between the second and third fin structures at a side of the second fin structure is removed, wherein said portion ends at a second distance from the midline between them;

step 5: disposing a third TiN layer, wherein the third TiN layer covers the second TiN layer on the first fin structure, the second fin structure, the second TiN layer on the third fin structure, and the second TiN layer on the fourth fin structure, wherein there is no gap in the third TiN layer between the second and the third fin structures; and step 6: etching to remove the first, the second and the third TiN layers from the first fin structure.

2. The method for improving the metal work function boundary effect according to claim 1, wherein the first fin structure in step 1 relates to an ultra-low threshold voltage N-type transistor; wherein the second fin structure relates to a standard threshold voltage N-type SRAM; wherein the third fin structure relates to a standard threshold voltage P-type SRAM; and wherein the fourth fin structure relates to an ultra-low threshold voltage P-type transistor.

3. The method for improving the metal work function boundary effect according to claim 1, wherein the first TiN layer on the first and second fin structures in step 1 comprises a gap; and wherein the first TiN layer on the third and fourth fin structures has no gap.

4. The method for improving the metal work function boundary effect according to claim 1, wherein the second TiN layer on the first fin structure and the second fin structure in step 3 comprises a gap.

5. The method for improving the metal work function boundary effect according to claim 1, wherein the second TiN layer on the fourth fin structure and the third fin structure in step 3 comprises a gap.

6. The method for improving the metal work function boundary effect according to claim 1, wherein the first distance in step 2 is greater than the second distance in step 4.

7. The method for improving the metal work function boundary effect according to claim 1, wherein the third TiN layer on the first fin structure and the second fin structure in step 5 comprises a gap.

8. The method for improving the metal work function boundary effect according to claim 1, wherein the third TiN layer on the third fin structure and the fourth fin structure in step 5 comprises a gap.

* * * * *